United States Patent
Gulas et al.

(10) Patent No.: US 11,209,459 B2
(45) Date of Patent: Dec. 28, 2021

(54) COMMON MODE REJECTION RATIO TEST SYSTEM AND METHOD

(71) Applicant: Texas Instruments Incorporated, Dallas, TX (US)

(72) Inventors: Scott Matthew Gulas, Sahuarita, AZ (US); Zebulan Keith Thomas, Tucson, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 158 days.

(21) Appl. No.: 16/774,365

(22) Filed: Jan. 28, 2020

(65) Prior Publication Data

US 2020/0264212 A1 Aug. 20, 2020

Related U.S. Application Data

(60) Provisional application No. 62/806,421, filed on Feb. 15, 2019.

(51) Int. Cl.
  *G01R 1/067* (2006.01)
  *G01R 31/28* (2006.01)
(52) U.S. Cl.
  CPC ..... *G01R 1/06766* (2013.01); *G01R 31/2831* (2013.01)
(58) Field of Classification Search
  CPC ... G01R 1/06766; G01R 31/2831; H03F 3/68; H03F 3/45475
  See application file for complete search history.

(56) References Cited

U.S. PATENT DOCUMENTS

| | | | |
|---|---|---|---|
| 4,045,735 A | 8/1977 | Worcester et al. | |
| 6,020,747 A | 2/2000 | Bahns et al. | |
| 7,256,593 B2 | 8/2007 | Treibergs | |
| 8,330,537 B1* | 12/2012 | Ghorpade | H03F 3/38 330/9 |
| 9,106,334 B2 | 8/2015 | Westlund et al. | |
| 2004/0113642 A1* | 6/2004 | Sugimoto | G01R 31/31926 324/762.01 |

(Continued)

OTHER PUBLICATIONS

"OPA2210 2.2-nV/√Hz Precision, Low-Power, 36-V Operational Amplifier", Texas Instruments, OPA2210, SB0S924B—Sep. 2018— Revised Mar. 2019, 32 pgs.

(Continued)

*Primary Examiner* — Dominic E Hawkins
(74) *Attorney, Agent, or Firm* — Ronald O. Neerings; Charles A. Brill; Frank D. Cimino (57) ABSTRACT

An electronic device test system includes a contactor having probe pairs with first and second conductive probes to couple to a respective conductive feature of a packaged electronic device or wafer die region. The system also includes a test circuit having a voltage source to provide a common mode voltage signal; a first buffer with a first input coupled to an output of the voltage source, an output coupled to a first conductive probe of a first probe pair, and a second input coupled to a second conductive probe of the first probe pair; and a second buffer with a first input coupled to the output of the voltage source, an output coupled to a first conductive probe of a second probe pair, and a second input coupled to a second conductive probe of the second probe pair.

20 Claims, 7 Drawing Sheets

(56) References Cited

U.S. PATENT DOCUMENTS

| | | | |
|---|---|---|---|
| 2006/0098506 A1* | 5/2006 | Kim | G11C 29/10 |
| | | | 365/201 |
| 2011/0129213 A1 | 6/2011 | Painchaud et al. | |
| 2016/0139178 A1* | 5/2016 | Johnson | G01R 1/30 |
| | | | 324/754.03 |
| 2017/0016953 A1* | 1/2017 | Beer | G01R 27/28 |

OTHER PUBLICATIONS

"INA240 High- and Low-Side, Bidirectional, Zero-Drift, Current-Sense Amplifier With Enhanced PWM Rejection", Texas Instruments, INA240, SBOS662B—Jul. 2016—Revised Feb. 2018, 41 pgs.

\* cited by examiner

COMMON MODE REJECTION RATIO TEST SYSTEM AND METHOD

CROSS-REFERENCE TO RELATED APPLICATION

Under 35 U.S.C. § 119, this application claims priority to, and the benefit of, U.S. provisional patent application No. 62/806,421, entitled "Method to Improve CMRR Test Accuracy for High Bias Current Amplifiers", and filed on Feb. 15, 2019, the entirety of which is hereby incorporated by reference.

BACKGROUND

Common mode rejection ratio (CMRR) is a measure of the ability of an amplifier to refrain from amplifying voltages common to both amplifier inputs. CMRR is calculated as the difference in two offset voltage measurements (Vos) made at two different common mode voltages, divided by the difference in the common mode voltages. During electronic device manufacturing, it is desirable to test common mode rejection performance of differential amplifiers, current sense amplifiers, instrumentation amplifiers and other circuits. Impedances of automated test circuit connections and switching circuits can affect the common mode signal applied to a device under test (DUT), and cause errors in the determined CMRR. For example, contactor or socket pins and wafer probe needles have additional parasitic resistance which differs for each insertion. Cleaning the test equipment helps, but cleaning contacts after every insertion is impractical. In addition, switching circuits have parasitic resistance which may be imbalanced and cause further errors in the determined CMRR. Moreover, these problems are exacerbated where the DUT is a high input bias device that has low input impedance, where imbalanced test circuit currents and parasitic resistances increase the CMRR measurement errors.

SUMMARY

In accordance with one aspect, a system includes a contactor and a test circuit coupled to the contactor. The contactor includes probe pairs with first and second conductive probes arranged to be coupled to a respective conductive feature of a device under test. The test circuit includes a voltage source, a first buffer, and a second buffer. The voltage source includes a first output to provide a common mode voltage signal, and a second output coupled to a reference node. The first buffer includes a first input coupled to the first output of the voltage source, an output coupled to a first conductive probe of a first probe pair, and a second input coupled to a second conductive probe of the first probe pair. The second buffer includes a first input coupled to the first output of the voltage source, an output coupled to a first conductive probe of a second probe pair, and a second input coupled to a second conductive probe of the second probe pair.

In one example, the test circuit includes a switch coupled between the first buffer and the first probe pair, and another switch coupled between the second buffer and the second probe pair. In another example test circuit includes a first switch coupled between the output of the first buffer and the first conductive probe of the first probe pair, a second switch coupled between the second input of the first buffer and the second conductive probe of the first probe pair, a third switch coupled between the output of the second buffer and the first conductive probe of the second probe pair, and a fourth switch coupled between the second input of the second buffer and the second conductive probe of the second probe pair.

In one example, the test circuit includes a buffer supply circuit referenced to the first output of the voltage source, where the buffer supply circuit includes a first output coupled to first supply nodes of the first and second buffers, and a second output coupled to second supply nodes of the first and second buffers. In one example, the test circuit includes a second supply circuit referenced to the reference node, where the second supply circuit includes a first output coupled to first and second conductive probes of a third probe pair arranged to be coupled to a conductive feature connected to a first supply node of the DUT, and a second output coupled to first and second conductive probes of a fourth probe pair arranged to be coupled to a conductive feature connected to a second supply node of the DUT.

In one example, the conductive probes of the probe pairs are pins or contacts configured to engage a respective conductive pin or lead feature of an integrated circuit DUT. In another example, the conductive probes are wafer probe needles configured to engage a respective bond pad of a semiconductor wafer DUT. In one example, the first and second buffers are operational amplifiers.

A test circuit is provided according to another aspect, including a voltage source, first and second buffers, and a buffer supply circuit. The voltage source includes a first output to provide a common mode voltage signal and a second output coupled to a reference node. The first buffer includes a first input coupled to the first output of the voltage source, an output arranged to be coupled to a first conductive probe of a contactor, and a second input arranged to be coupled to a second conductive probe of the contactor. The second buffer includes a first input coupled to the first output of the voltage source, an output coupled to a third conductive probe of the contactor, and a second input coupled to a fourth conductive probe of the contactor. The buffer supply circuit is referenced to the first output of the voltage source. The buffer supply circuit includes a first output coupled to first supply nodes of the first and second buffers, and a second output coupled to second supply nodes of the first and second buffers.

In one example, the test circuit includes a switch coupled between the first buffer and one of the first and second conductive probes, and another switch coupled between the second buffer and one of the third and fourth conductive probes. In another example, the test circuit includes a first switch coupled between the output of the first buffer and the first conductive probe, a second switch coupled between the second input of the first buffer and the second conductive probe, a third switch coupled between the output of the second buffer and the third conductive probe, and a fourth switch coupled between the second input of the second buffer and the fourth conductive probe. In one example, the first and second buffers are operational amplifiers.

A method is provided according to another aspect. The method includes engaging probe pairs of a contactor to respective conductive features of a device under test (DUT), coupling outputs of first and second buffers to respective first and second probe pairs of the contactor, applying a common mode voltage signal at a first amplitude to non-inverting inputs of the first and second buffers, and measuring a first output voltage signal of the DUT at another probe pair of the contactor while applying the common mode voltage signal at the first amplitude. The method further includes adjusting the common mode voltage signal to a different second amplitude, measuring the output voltage signal of the DUT while applying the common mode voltage signal at the second amplitude, and computing a common mode rejection ratio of the DUT based on the measured output voltage signals and the first and second amplitudes of the common mode voltage signals.

In one example, the method further includes closing a switch between the first buffer and the first probe pair and closing another switch between the second buffer and the second probe pair. In another example, the method further includes closing a first switch between the output of the first buffer and a first conductive probe of the first probe pair, closing a second switch between an inverting input of the first buffer and a second conductive probe of the first probe pair, closing a third switch between the output of the second buffer and a first conductive probe of the second probe pair, and closing a fourth switch between an inverting input of the second buffer and a second conductive probe of the second probe pair.

In one example, the method further includes powering the first and second buffers with supply voltages referenced to the common mode voltage signal.

DETAILED DESCRIPTION

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are described in the context of functions which in some cases result from configuration and/or interconnection of various structures when circuitry is powered and operating.

Figure 1:
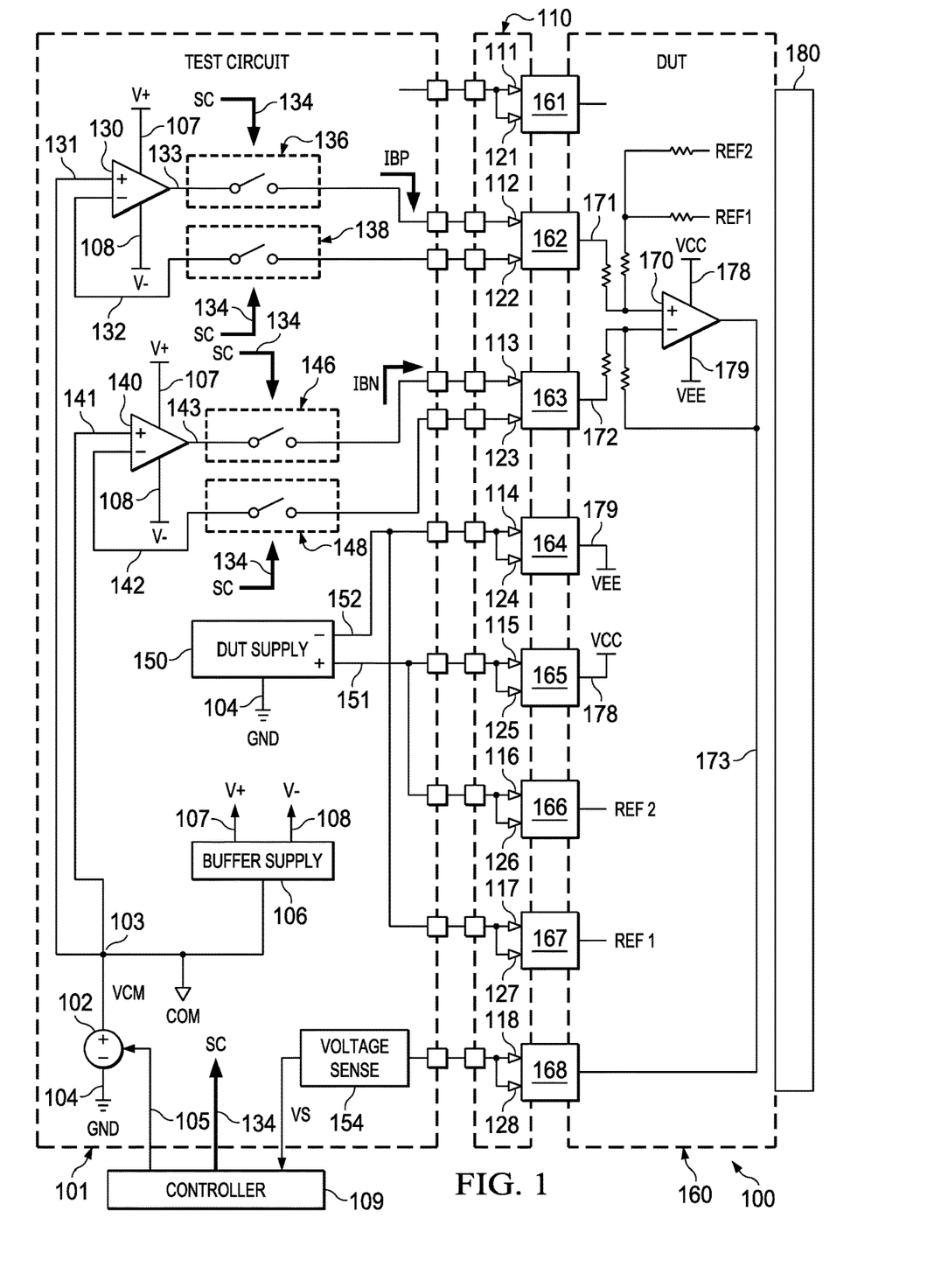
FIG. 1 is a schematic diagram of a test system with an included test circuit, a contactor having pairs of conductive probes, two switches and a buffer for each DUT input connection to automatically test common mode rejection ratio of a packaged electronic device or wafer die region containing electronic circuits.

FIG. 1 shows a test system 100 with an included test circuit 101. The test circuit 101 includes a voltage source 102 with a first output 103 that provides a common mode voltage signal VCM, as well as a second output coupled to a reference node 104. In one example, the reference node 104 is a ground reference, and the common mode voltage signal VCM is a DC voltage referenced to a voltage (e.g., GND) of the reference node 104. The voltage source 102 has a control input 105 allowing external control of the amplitude and/or polarity of the common mode voltage signal VCM. The test circuit 101 also includes a buffer supply circuit 106 referenced to the first output 103 of the voltage source 102. The buffer supply circuit 106 includes a first output 107 that provides a first (e.g., positive) supply voltage signal V+ referenced to the common mode voltage signal VCM of the voltage source 102 (e.g., referenced to a signal common voltage COM in FIG. 1, where V+ is positive with respect to VCM). In addition, the buffer supply circuit 106 includes a second output 108 that provides a second supply voltage signal V− (e.g., negative with respect to VCM). The system 100 also includes a controller 109 that provides a control signal to the control input 105 of the voltage source 102.

In addition, the system 100 includes a contactor 110. In one example, the contactor 110 is a socket for testing installed integrated circuit DUTs for final testing. In another example, the contactor 110 is a wafer probe for testing probed die regions of a processed semiconductor wafer DUT for wafer probe testing. In one example, the test circuit 101 is or includes one or more printed circuit boards with the described circuitry and one or more connectors arranged or otherwise adapted to be connected to a mating connector of the contactor 110 to provide the electrical interconnections shown in FIG. 1.

The contactor 110 includes multiple probe pairs. The probe pairs in one example provide Kelvin contacts to allow separate application of a voltage signal through a first conductive probe (e.g., referred to as a force contact), along with sensing of a voltage or current of the probed conductive feature through the second conductive probe (e.g., referred to as a sense contact). The individual probe pairs include first and second conductive probes arranged to be coupled to a respective conductive feature of a DUT. When the contactor 110 is engaged with the DUT, both the first conductive probe and the second conductive probe are mechanically engaged with, and are directly electrically coupled to, the associated conductive feature of a DUT. One example probe pair 111/121 in FIG. 1 includes a conductive probe 111 and a conductive probe 121. A probe pair 112/122 (referred to herein as a first probe pair) includes a conductive probe 112 and a conductive probe 122, a probe pair 113/123 (referred to herein as a second probe pair) includes a conductive probe 113 and a conductive probe 123. In the illustrated example, the probe pair 111/121 interfaces with a conductive feature of an installed DUT that is not connected to any electrical circuit of the DUT, and can be referred to as a third probe pair 111/121, although positioned on the contactor 110 to engage a first pin of an engaged packaged electronic device. A fourth probe pair 114/124 includes a conductive probe 114 and a conductive probe 124. Similarly, a fifth probe pair 115/125 includes a conductive probe 115 and a conductive probe 125, a sixth probe pair 116/126 includes a conductive probe 116 and a conductive probe 126, a seventh probe pair 117/127 includes a conductive probe 117 and a conductive probe 127, and an eighth probe pair 118/128 includes a conductive probe 118 and a conductive probe 128. In the example of FIG. 1, the contactor 110 includes eight probe pairs 111/121, 112/122, 113/123, 114/124, 115/125, 116/126, 117/127 and 118/128 to interface with eight conductive features of a DUT, such as an 8-pin IC DUT. In another implementation, the contactor 110 has fewer than eight probe pairs. In yet another implementation, the contactor 110 has more than eight probe pairs.

The test circuit 101 also includes buffers for interfacing inputs of a DUT with the voltage source 102 for common mode testing of the DUT. A first buffer 130 includes a first input 131 (e.g., a non-inverting input), a second input 132 (e.g., an inverting input), an output 133, a first (e.g., positive) supply node coupled to the first output 107 of the buffer supply circuit 106, and a second supply node coupled to the second output 108 of the buffer supply circuit 106. The first input 131 is coupled to the first output 103 of the voltage source 102. The output 133 of the first buffer 130 is arranged to be coupled to the first conductive probe 112 of the first probe pair 112/122 of the contactor 110, and the second input 132 is arranged to be coupled to the second conductive probe 122 of the first probe pair 112/122. In operation, the buffer output 133 provides a bias current IBP to a positive (e.g., non-inverting) input of a connected DUT. In one example, the output 133 of the first buffer 130 is coupled directly to the conductive probe 112 of the first probe pair 112/122 and the second input 132 of the buffer 130 is coupled directly to the conductive probe 122 of the first probe pair 112/122.

Figure 2:
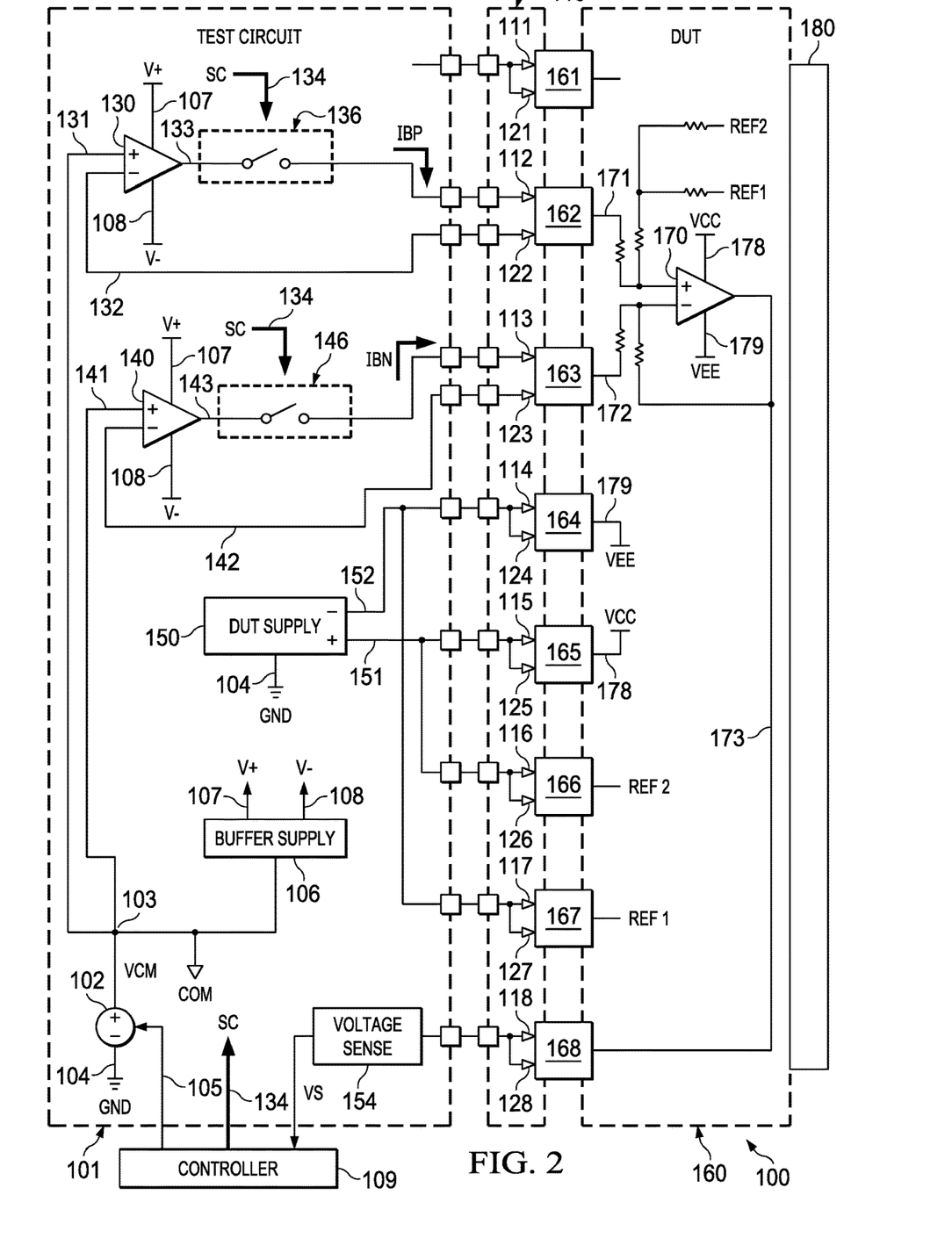
FIG. 2 is a schematic diagram of another test system with pairs of conductive probes, one switch and a buffer for each DUT input connection according to another embodiment.

Referring also to FIG. 2, in another example, one or more switches are coupled between the first buffer 130 and the first probe pair 112/122, in either or both of the output circuit branch of the first buffer 130 and the second input circuit branch of the first buffer 130. If included, the switch or switches facilitate use of the buffer for testing multiple circuit components in a single IC insertion or wafer probe touchdown interconnection with the DUT. The switch or switches have a control input 134 and is/are operated in one example according to a switch control signal SC from the controller 109. The example test circuit 101 in FIG. 1 includes a first switch 136 coupled between the output 133 of the first buffer 130 and the conductive probe 112 of the first probe pair 112/122, and a second switch 138 coupled between the second input 132 of the first buffer 130 and the conductive probe 122 of the first probe pair 112/122. The switches 136 and 138 each have a control input 134 for switch operation according to the switch control signal SC.

The test circuit 101 also includes a second buffer 140 to interface a second input of the DUT with the first output 103 of the voltage source 102 for common mode testing. In one example, the respective first and second buffers 130 and 140 are operational amplifiers (OP-AMPs). The buffers 130 and 140 in one example are low noise OP AMPs with low offset and low bias-current specifications, such as an OPA 2210 operational amplifier circuit from Texas Instruments Incorporated. In another example, the buffers 130 and 140 are other forms of buffer amplifier circuits. The first output 107 of the buffer supply circuit 106 is coupled to first supply nodes of the first and second buffers 130 and 140, and the second output 108 is coupled to second supply nodes of the first and second buffers 130 and 140 as shown in FIG. 1.

The second buffer 140 includes a first input 141 coupled to the first output 103 of the voltage source 102. As shown in FIG. 1, the inputs 131 and 141 of the respective buffers 130 and 140 are star connected to the first output 103 of the voltage source 102. The individual connections from the first output 103 to the inputs 131 and 141, and the connection from the first output 103 to the buffer supply circuit 106 are separate from one another and are preferably of equal length and impedance. The second buffer 140 also includes an output 143 coupled to a conductive probe 113 of a second probe pair 113/123 of the contactor 110, and a second input 142 coupled to a conductive probe 123 of the second probe pair 113/123. In operation, the second buffer output 143 provides a bias current IBN to a negative (e.g., inverting) input of a connected DUT. The second buffer 140 also includes a first (e.g., positive) supply node coupled to the first output 107 of the buffer supply circuit 106, and a second (e.g., negative) supply node coupled to the second output 108 of the buffer supply circuit. In one example, the output 143 of the second buffer 140 is coupled directly to the conductive probe 113 of the second probe pair 113/123 and the second input 122 of the second buffer 140 is coupled directly to the conductive probe 123 of the second probe pair 113/123.

In another example, one or more switches are coupled between the second buffer 140 and the second probe pair 113/123. The switch or switches have a control input 134 and is/are operated according to the switch control signal SC. The example of FIG. 1 includes a third switch 146 and a fourth switch 148 operated according to the switch control signal SC. The third switch 146 is coupled between the output 143 of the second buffer 140 and the conductive probe 113 of the second probe pair 113/123. The fourth switch 148 is coupled between the second input 142 of the second buffer 140 and the conductive probe 123 of the second probe pair 113/123. In operation, the switches 136, 138, 146 and 148 allow the buffers 130 and 140 to be selectively connected to, or disconnected from, the respective probe pairs 112/122 and 113/123 according to the switch control signal SC from the controller 109.

FIG. 2 shows another embodiment of the system 100, in which the switches 138 and 148 of FIG. 1 are omitted. In this example, a single switch 136 is coupled between the output 133 of the first buffer 130 and the conductive probe 112 of the first probe pair 112/122, and the second input 132 of the first buffer 130 is directly coupled to the conductive probe 122 of the first probe pair 112/122. Also, a single switch 146 is coupled between the output 143 of the second buffer 140 and the conductive probe 113 of the second probe pair 113/123, and the second input 142 of the second buffer 140 is directly coupled to the conductive probe 123 of the second probe pair 113/123. In another implementation, a single switch is provided on the second input in each buffer circuit (e.g., switches 138 and 148 in FIG. 1 are included) and the buffer outputs 133 and 143 are directly coupled to the respective conductive probes 112 and 113 (e.g., switches 136 and 146 of FIG. 1 are omitted). In yet another implementation, all the switches 136, 138, 146 and 148 are omitted, the buffer outputs 133 and 143 are directly coupled to the respective conductive probes 112 and 113, and the inverting inputs 132 and 142 are directly coupled to the respective conductive probes 122 and 123.

The example test circuit 101 in FIGS. 1 and 2 includes a second supply circuit 150 configured to power the circuitry (e.g., a tested amplifier) of a connected DUT. The second supply circuit 150 is referenced to the reference node 104. The second supply circuit 150 includes a first output 151 that provides a positive DUT supply voltage signal VCC (e.g., a positive DC voltage relative to the voltage GND of the reference node 104). The first output 151 is coupled to conductive probes 115 and 125 of the probe pair 115/125. A second output 152 of the second supply circuit 150 provides a negative DC supply voltage signal VEE relative to the voltage GND of the reference node 104. The second output 152 is coupled to the conductive probes 114 and 124 of the probe pair 114/124. In other implementations, the DUT 160 is supplied by a positive supply and ground (e.g., 5 V and 0 V) without any negative (below ground) supply.

The test circuit 101 in FIGS. 1 and 2 also includes a voltage sense circuit 154 with an input coupled to the conductive probes 118 and 128 of the final probe pair 118/128. The voltage sense circuit 154 includes an output that provides a sensed voltage signal VS to the controller 109 that represents a voltage applied to the input of the voltage sense circuit 154. In one example, the voltage sense circuit 154 includes analog signal conditioning circuitry, buffer amplifiers, level shifters, etc., to provide an analog sensed voltage signal VS to the controller 109. In another example, the voltage sense circuit 144 includes analog-to-digital conversion circuitry that provides a digital sensed voltage signal VS to the controller 109.

FIGS. 1 and 2 show the system 100 engaged with a DUT 160. In the illustrated example, the DUT 160 includes conductive features 161, 162, 163, 164, 165, 166, 167 and 168. The conductive feature 161 in this example is not connected to electronic circuits of the DUT 160. In the illustrated example, the conductive feature 161 is a first pin of a packaged electronic device DUT 160 that is not connected to any electrical circuit of the DUT 160, and can be referred to as a third conductive feature of the DUT 160. The conductive feature 162 is coupled to electronic circuitry of the example DUT 160 and is referred to herein as a first conductive feature. The conductive feature 163 is referred to herein as a second conductive feature. A fourth conductive feature 164, a fifth conductive feature 165, a sixth conductive feature 166, a seventh conductive feature 167 and an eighth conductive feature 168 are coupled to electronic circuitry of the example DUT 160. The conductive probes of the probe pairs 111/121, 112/122, 113/123, 114/124, 115/125, 116/126, 117/127 and 118/128 are engaged with the respective conductive features 161, 162, 163, 164, 165, 166, 167 and 168 of the DUT 160. The DUT 160 includes one or more circuits with inputs and an output to be tested for common mode rejection ratio performance via the voltage source 102 and the buffers 130 and 140 of the test circuit 101. In one example for integrated circuit final testing, the DUT 160 is an IC or other packaged electronic device, and the conductive probes 111-118 and 121-128 are pins or contacts configured to engage a respective conductive pin or lead feature 161, 162, 163, 164, 165, 166, 167, 168 of the integrated circuit DUT 160 (e.g., FIG. 5 below). In another implementation for wafer probe testing of a processed semiconductor wafer DUT, the conductive probes 111-118 and 121-128 are wafer probe needles configured to engage a respective bond pad 161, 162, 163, 164, 165, 166, 167, 168 of a semiconductor wafer DUT 160 (e.g., FIG. 7 below).

FIGS. 1 and 2 show an example with the contactor 110 engaging an 8-pin instrumentation amplifier IC, such as an INA240 available from Texas Instruments Incorporated. The example DUT 160 in FIGS. 1 and 2 includes an amplifier 170 coupled to a resistor network, a first input 171 coupled to the first conductive feature 162, a second input 172 coupled to the second conductive feature 163, an output 173 coupled to the eighth conductive feature 168, and reference connections (e.g., REF2 and REF1) coupled to the respective sixth and seventh conductive features 166 and 167 of the DUT 160. In addition, the amplifier 170 has positive and negative supply rail connections 178 and 179 respectively coupled to the respective conductive features 165 and 164 of the DUT 160 to receive the DUT supply signals VCC and VEE from the second supply circuit 150. FIGS. 1 and 2 also schematically show a handler apparatus 180 that causes the conductive probes 111-118 and 121-128 of the contactor 110 to engage and electrically couple to the conductive features 161, 162, 163, 164, 165, 166, 167 and 168 of the DUT 160.

This example DUT 160 is used for current sensing in high-side or low-side current sensing, such as for power conversion system applications. The DUT example 160 has low input impedances and corresponding high input bias currents during operation. Moreover, because of the resistive network structure of the DUT input circuitry, the bias current increases with increased common mode voltages applied to the inputs. As a result, measuring CMRR by direct connection of the common mode voltage source 102 to the DUT input features 162 and 163 without the buffers 130 and 140 leads to inaccurate measurements of common mode rejection performance.

In the illustrated test system 100, the applied common mode voltage signal VCM is buffered by the test circuit buffers 130 and 140, and the buffers 130 and 140 are supplied by the buffer supply signals V+ and V− referenced to the common mode voltage VCM. In this example, the first output 151 of the second supply circuit 150 is arranged to be coupled through the test circuit 101 and its interface through the contactor 110 to a conductive feature 165 connected to the first supply node 178 of the DUT 160. The second output 152 is arranged to be coupled to the conductive feature 164 connected to the second supply node 179 of the DUT 160. In addition, the first buffer output 133 is coupled to a first conductive probe 112 of the first probe pair 112/122, and the probe pair 112/122 is arranged to be coupled to the second conductive feature 162 connected to the first input node 171 of the DUT 160. Furthermore, the output 143 of the second buffer 140 is coupled to the first conductive probe 113 of the second probe pair 113/123, which is arranged to be coupled to the second conductive feature 163 connected to the second input node 172 of the DUT 160.

Figure 3:
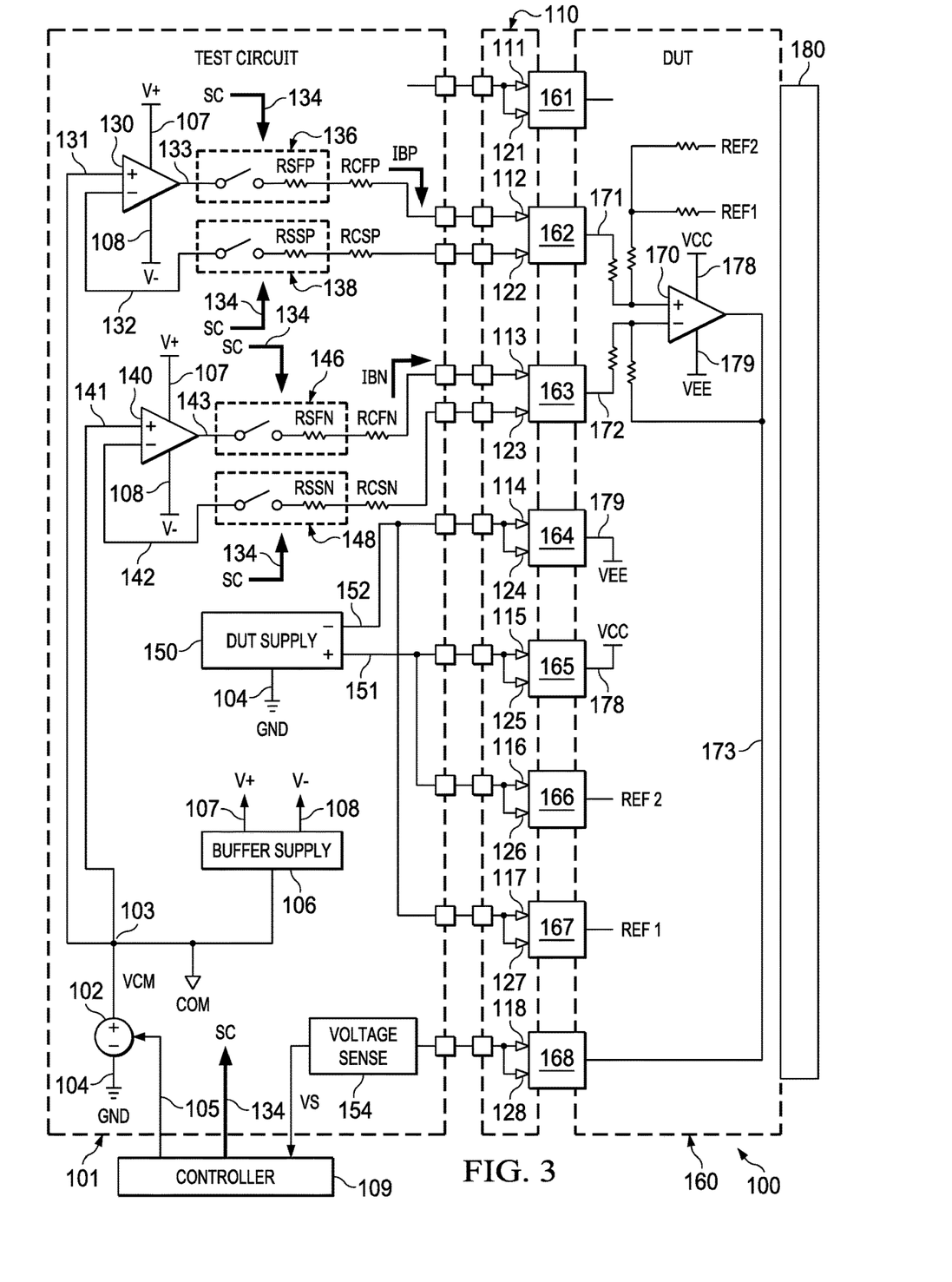
FIG. 3 is a schematic diagram of an electrical model of the test system of FIG. 1 showing switch and contact resistances.

Referring also to FIG. 3, the buffers 130 and 140 in the system 100 facilitate accurate CMRR testing and measurement of common mode rejection performance of the DUT 160, even for amplifier DUT circuits with low input impedance and high input bias currents, and even for changing contact resistance of the interconnection of the DUT 160 with the contactor 110. FIG. 3 shows a schematic diagram of an electrical model of the test system of FIG. 1 with associated switch resistances RSFP, RSSP, RSFN and RSSN, and contact resistances RCFP, RCSP, RCFN and RCSN. The resistance nomenclature Rxyz includes R for resistance, x for S=switch, C=contact, y for F=force, S=sense, and z for P=positive input, N=negative input. In the illustrated configuration, the included positive input switch resistances RSFP and RSSP of the respective switches 136 and 138 are in series with contact resistances RCFP and RCSP of the respective conductive probes 112 and 122 of the first probe pair 112/122 engaged with the conductive feature (e.g., pin) 162 of the DUT 160. In addition, the included negative input switch resistances RSFN and RSSN of the respective switches 146 and 148 are in series with contact resistances RCFN and RCSN of the respective conductive probes 113 and 123 of the second probe pair 113/123 engaged with the conductive feature (e.g., pin) 163 of the DUT 160.

The test system 100 provides the contactor 110 with pairs of kelvin contacts, two switches, and a buffer for each of the DUT input connections 171 and 172 to automatically test common mode rejection ratio of an integrated circuit or other packaged electronic device, or of a wafer die region containing electronic circuits. The common mode rejection ratio testing in one example includes measuring offset voltages at two different common mode voltages applied to the DUT inputs 171 and 172. The offset voltage measurements are made by applying a common mode voltage signal VCM to the buffers 130 and 140 and making measurements at the output pin 168 via the voltage sense circuit 154. The buffers 130 and 140 accommodate the parasitic switch resistances RSFP and RSFN which may or may not be equal in the test circuit 101, as well as the parasitic contactor (socket) pin resistances RCFP, RCSP, RCFN and RCSN which can vary for each insertion or touch down. This facilitates use with contactors 110 that are not cleaned after every insertion or touch down for accurate CMRR testing at wafer probe and/or final test, even for DUT circuits with high input bias currents.

In the test system 100 with one switch in each buffer circuit (e.g., FIG. 2), even where the DUT offset voltage Vos=0, the applied offset appears to be (IBP*RCFP)–(IBN*(RSFN+RCFN)). The measurement is systematically harmed by RSFN, and randomly by both RCFN and RCFP. To help reduce this error, a second switch is used (e.g., as shown in FIGS. 1 and 3) so that the inputs 171 and 172 see approximately symmetrical impedances. Even if the DUT offset voltage Vos=0, the actual offset voltage appears to be (IBP*(RSFP+RCFP))–(IBN*(RSFN+RCFN)). The added switch resistance RSFP helps cancel systematic error cause by the resistance RSFN, leaving a typically reduced systematic error (IBP–IBN)*(RSFP–RSFN), but random errors remain due to the parasitic contact resistance that typically changes with each insertion or touch down. Thus, although the measurement is now sensitive to the mismatch of RSFN and RSFP, rather than to RSFN itself (typically reducing the overall error), CMRR testing without the buffers 130 and 140 still suffers from inaccuracies due to variation in the contact resistances.

The test circuit 101 further improves measurement accuracy by star connecting the buffers 130 and 140 to the common mode voltage VCM at the output 103 of the voltage source 102, and coupling of the buffer outputs 133 and 143 to the respective conductive probes (e.g., the force contacts) 112 and 113, while the buffer inverting inputs (e.g., feedback terminals) 132 and 142 are coupled to the respective conductive probes (e.g., sense contacts) 122 and 123. In this configuration, the input circuit bias currents IBP and IBN of the DUT circuit are provided by the respective buffers 130 and 140.

The negative feedback loops of the buffer circuits sense the voltages at the respective conductive probe (e.g., the sense contact) and the buffers 130 and 140 appropriately adjust the voltages at their respective outputs 133 and 143 to buffer the common mode voltage signal VCM. Because little current (e.g., picoamps) flows into the high impedance inputs 131, 132, 141 and 142 of the buffers 130 and 140, the parasitic switch resistances RSFP and RSFN and contact resistances RCFP, RCSP, RCFN and RCSN contribute negligible errors. The small IBP and IBN on the respective buffer amps 130 and 140 means that resistances on the sense lines (RSSP, RCSP, RSSN, and RCSN) contribute negligible errors. The resistances on the force lines have the IB of the DUT 160 going through them, so they still have voltage drops across them, although these voltage drops are compensated by the buffers 130 and 140. If the instrumentation amplifier DUT bias currents change between application of two different amplitudes of the common mode voltage signal VCM, the buffers 130 and 140 source the respective currents IBP and IBN with little or no impact on the output voltage measurement accuracy. In this regard, any differential offset between the two inputs 171 and 172 of the DUT 160 will not change as the applied common mode voltage signal VCM changes, and the measured change in the DUT output VS is the result of the CMRR of the DUT 160.

Coupling the buffers 130 and 140 to the inputs 171 and 172 of the instrumentation amplifier DUT 160 in this example prevents the bias currents IBP and IBN from causing errors in the common mode rejection ratio testing. When the common mode voltage signal VCM is changed during testing, the DUT 160 conducts more bias current that would cause errors from switch and contact resistance if the buffers 130 and 140 were not present. In the described examples, the buffers 130 and 140 supply any needed bias current IBP and/or IBN through the kelvin contacts provided by the respective probe pairs 112/122 and 113/123. In addition, powering the buffers 130 and 140 with power from the floating buffer supply circuit 106 referenced to the common mode voltage signal VCM prevents the buffers 130 and 140 from changing their offsets at the two common mode voltage amplitudes used during testing, and any buffer offsets are cancelled out by the two-point CMRR measurement. In the illustrated examples, moreover, the star connection of the buffers 130 and 140 and the buffer supply circuit 106 to the VCM voltage source output 103 helps ensure that any parasitic resistance between the voltage source output 103 and the buffers 130 and 140 does not create an error due to the changing bias currents IBP and IBN, and keeps any bias errors consistent at different applied common mode voltage amplitudes.

A different approach without the buffers 130 and 140 in the test circuit is to instead make a precise measurement of the input voltage at the DUT inputs 171 and 172 using kelvin contact pins, and accounting for the measured voltages in the CMRR computation. However, such a measurement would need to be made to single microvolt accuracy and would require test time and/or additional tester resources. For example, a serial measurement typically adds 35 to 50 ms of test time and some measurement uncertainty remains. Using the example test circuits 101 with the buffers 130 and 140 removes these measurements and reduces test time. In one example, the test system 100 includes Eagle Test Systems ETS88 high performance test equipment with specified maximum test times, and the use of the buffers 130 and 140 can reduce the test times by 15% or more while improving the accuracy and precision of the CMRR measurement.

Figure 4:
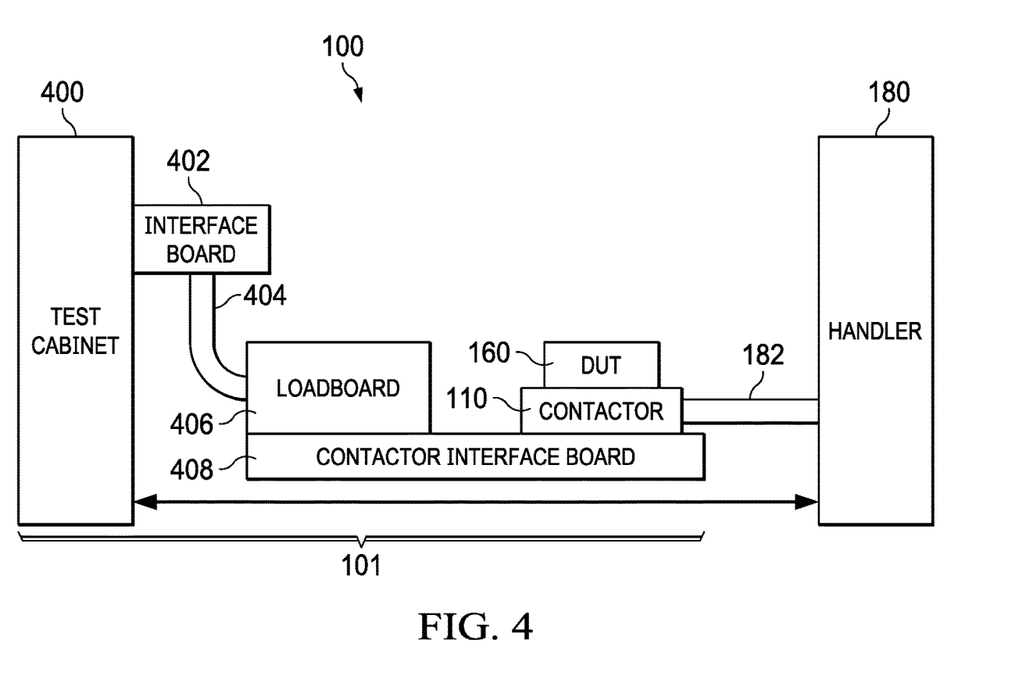
FIG. 4 is a system diagram of a final test system implementation for testing an integrated circuit electronic device.

FIG. 4 shows an example implementation of a final test implementation of the system 100 for testing an integrated circuit electronic device DUT 160. The system implementation in FIG. 4 includes the contactor 110 to interface with an IC DUT 160 as described above. The system implementation includes a test cabinet 400 with an interface board 402 connected by a cable 404 to a loadboard 406. The loadboard 406 is installed on a contactor interface board 408, and the contactor 110 is connected to the contactor interface board 408. The handler 180 includes a support arm 182 that controls the electrical interfacing of the contactor 110 with the DUT 160. In this example, the test circuit 101 of FIGS. 1-3 is implemented in one or more of the test cabinet 400, the interface board 402, the loadboard 406 and/or the contactor interface board 408. In one implementation, the test cabinet and the interface board 402 include an Eagle Test Systems ETS-88 high performance setup.

In this example, the tester voltage source 102 in FIGS. 1-3 is included in the test cabinet 400 or the interface board 402, and provides a programmed common mode voltage signal VCM through connections from the test cabinet 400 to the interface board 402. The interface board 402 passes the common mode voltage signal VCM from the test cabinet 400 to a cable connector of the interface board 402 without electrically changing the signal VCM, and the cable 404 passes the common mode voltage signal VCM to the loadboard 406. The loadboard 406 in one example includes the buffer supply circuit 106, for example, implemented using one or more DC to DC converters for positive and negative floating supplies that supply the voltage signals V+ and V-respectively above and below the common mode voltage signal VCM (e.g., V+=VCM+15V and V-=VCM-15V). The signal and power connections of the common mode voltage signal VCM to the output 103 of the voltage source 102 (e.g., FIGS. 1-3) are separate in a star layout connection to the respective DC/DC converter reference and to the kelvin buffer non-inverting inputs 131 and 141. The contactor interface board 408 is changeable to allow different contactors 110 to be used for different DUT IC footprints to be tested with the same loadboard 406. In one example, the buffers 130 and 140 are implemented on the loadboard 406, and the switches 136, 138, 146 and 148, if included, are implemented on the contactor interface board 408. In one implementation, the contactor 110 is an integrated circuit socket with the probe pairs to interface the force and sense interconnections of the test circuit 101 from the contactor interface board 408 to pins or leads 161-168 of an installed IC DUT 160. The handler 180 and the associated support arm 182 holds or otherwise supports the DUT 160 on the contactor 110 during testing, and moves DUTs 160 to and from the contactor 110 between tests.

Figure 5:
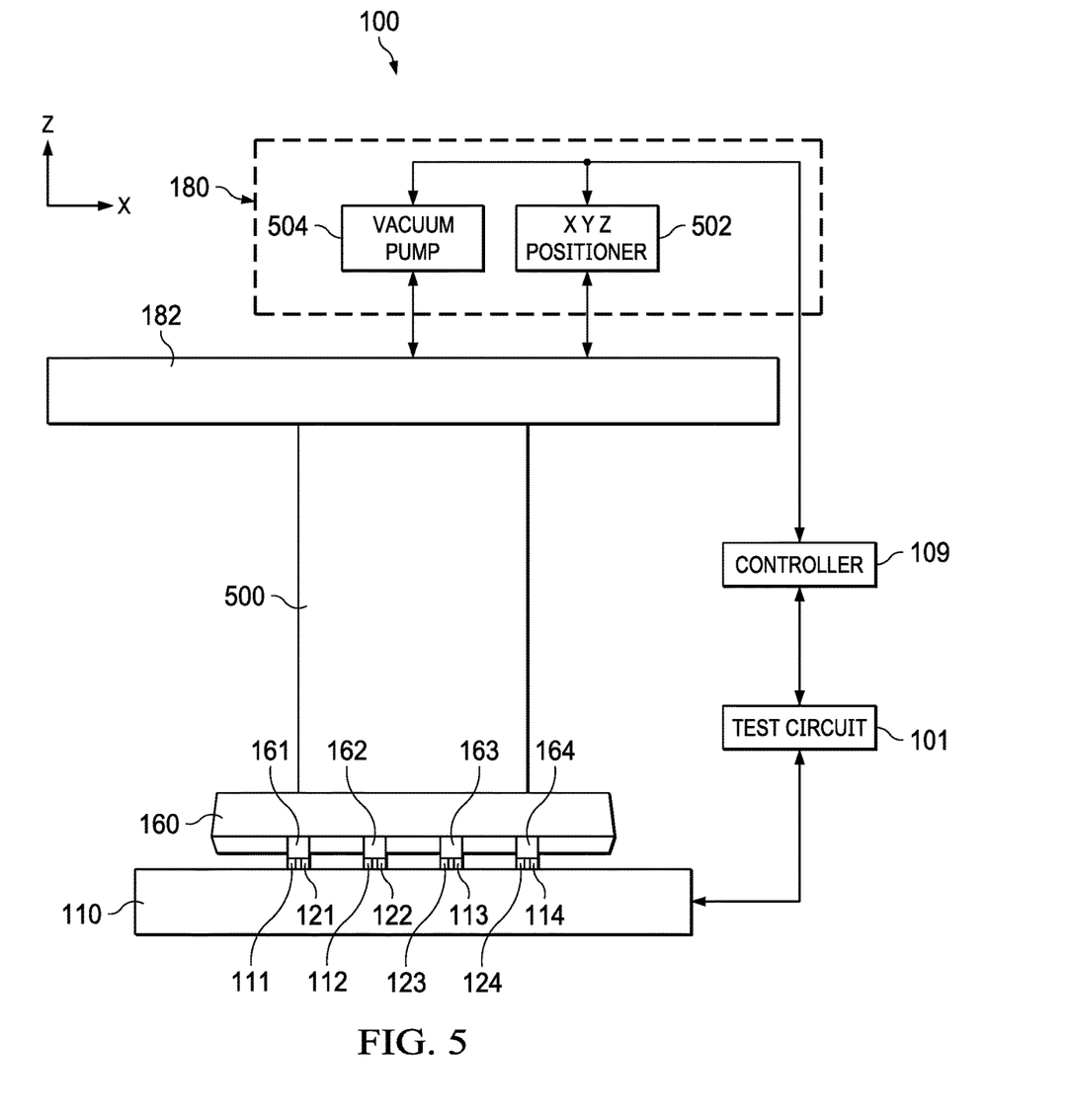
FIG. 5 is another system diagram of a final test system implementation for testing an integrated circuit electronic device.

FIG. 5 shows another view of an example final test implementation of the system 100 for testing an integrated circuit electronic device DUT 160. The system 100 includes the controller 109, test circuit 101, contactor 110, handler 180 and support arm 182 as described above. In this example, the support arm 182 engages and supports the IC DUT 160 through vacuum pressure applied through a vacuum tube or nozzle 500 to engage a top surface of the IC package of the DUT 160. The handler 180 in this example includes a positioner apparatus 502 and a vacuum pump 504. The vacuum pump 504 applies vacuum pressure through the nozzle 500 to selectively engage or release a DUT 160, and the positioner apparatus 502 controls the positioning of the arm 182, the nozzle 500 and the engaged DUT 160 for automated device electrical testing. When engaged with the contactor 110, the leads 161-168 of the DUT 160 are contacted by the conductive probes 111-118 and 121-128 (Kelvin contacts) of the contactor 110. The handler 180 facilitates engagement, movement and testing DUTs 160 in an automated process after device packaging in a fabrication process. The positioner apparatus 502 of the handler 180 in one example operates in a repetitive sequence to pick up a DUT 160 from a tray or carrier structure (not shown), transport the DUT 160 to a test fixture with the contactor 110, engage the DUT 160 with the contactor 110 for automated device electrical tests including common mode rejection ratio testing, and to return the tested DUT 160 to the carrier structure. The positioner apparatus 502 can include linear or rotary servos, positioner actuators and mechanical supporting structures to move the support arm 182 to any position and orientation in a three dimensional space. The controller 109 controls operation of the test circuit 101 and the positioner apparatus 502.

Figure 6:
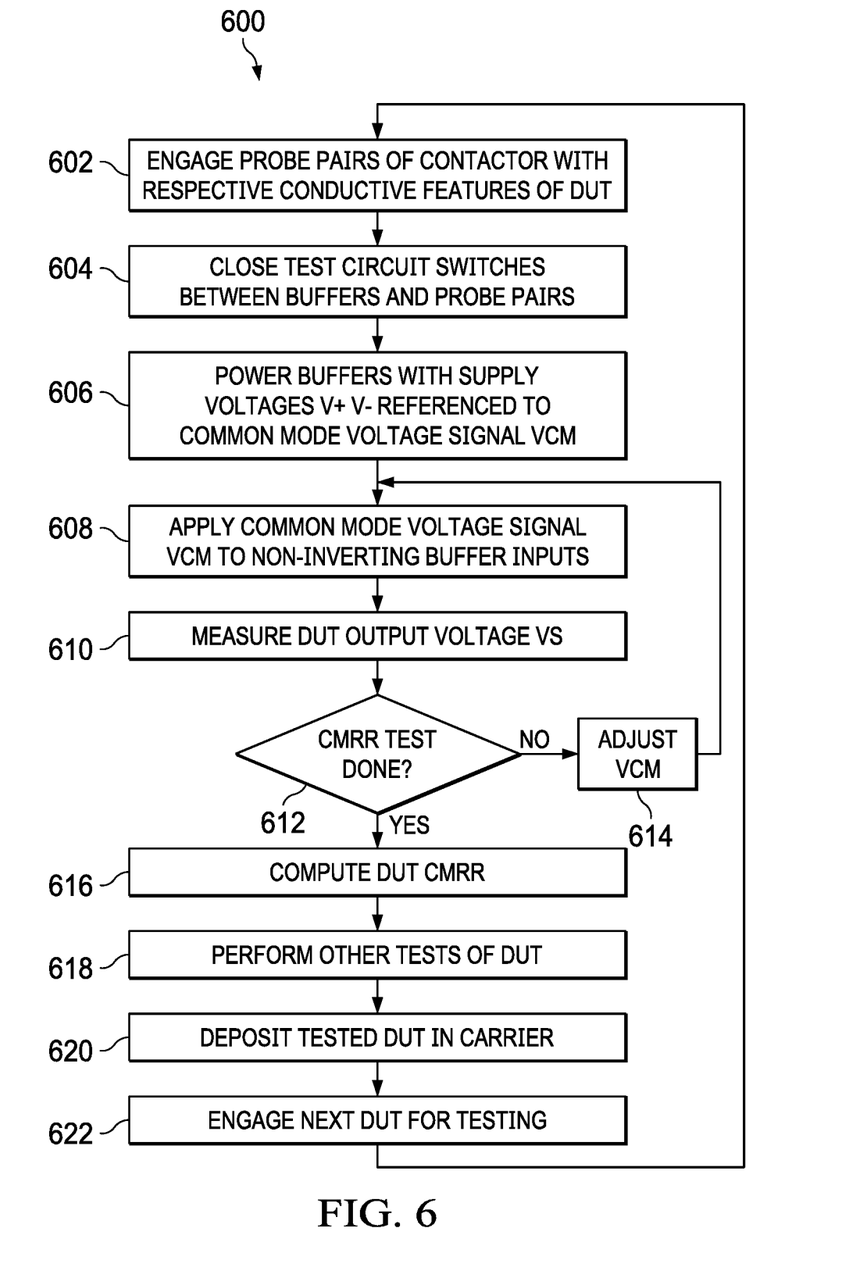
FIG. 6 is a flow diagram of a common mode rejection ratio test method according to another aspect.

FIG. 6 shows an example electronic device test method 600 that can be implemented in the system 100 of FIGS. 1-5. In one example, the controller 109 of the test system 100 implements the method 600 for each of a series of device testing cycles. The method 600 includes engaging the contactor probe pairs to respective conductive features of the DUT 160 at 602. In one example, the controller 109 in FIG. 5 causes the positioner apparatus 502 to engage the DUT 160 with the nozzle 500 using vacuum pressure from the vacuum pump 504, and translates the engaged DUT 160 downward along the -Z direction in FIG. 5 such that the contactor probe pairs 111/121, 112/122, 113/123, 114/124, 115/125, 116/126, 117/127 and 118/128 are engaged to respective conductive features 161, 162, 163, 164, 165, 166, 167 and 168 of the DUT 160. In the IC final test example of FIGS. 4 and 5, the processing at 602 in one example includes engaging pins or contacts of the contactor 110 to a respective conductive pin or lead feature 161, 162, 163, 164, 165, 166, 167 or 168 of an integrated circuit DUT 160. In a semiconductor wafer probe test implementation (e.g., FIG. 7 below), the processing at 602 includes engaging wafer probe needle pairs 111/121, 112/122, 113/123, 114/124, 115/125, 116/126, 117/127 and 118/128 of the contactor 110 to respective bond pads 161, 162, 163, 164, 165, 166, 167, 168 of a semiconductor wafer DUT 160.

The method 600 continues at 604 with closing test circuit switches (e.g., any included switches 136, 138, 146 and/or 148 described above) between the buffers 130 and 140 and the probe pairs to couple the buffer outputs 133 and 143 and to couple the inverting inputs 132 and 142 to the respective first and second probe pairs 112/122 and 113/123 of the contactor 110. Where the test circuit 101 does not include any of the switches 136, 138, 146 or 148, the step 604 in FIG. 6 is omitted. The method 600 continues at 606 with powering the first and second buffers 130 and 140 with supply voltages V+ and V- referenced to the common mode voltage signal VCM. In one example, this includes enabling the buffer supply circuit 106 of FIGS. 1-3 above. In another implementation, the buffers 130 and 140 are powered before testing any devices and then the buffers would be powered down after testing to reduce test time. In this regard, the buffers 130 and 140 can be powered up in between DUT tests as long as VCM is brought to ground so a new DUT is not engaged (e.g., touch down) on a high voltage. In this implementation, only VCM is moved between DUTs 160 and the buffer supplies can remain powered for the duration of the time all DUTs are tested.

At 608, the common mode voltage signal VCM is applied at a first amplitude to the non-inverting buffer inputs 131 and 141, and a first output voltage signal VS of the DUT 160 is measured at 610 while applying the common mode voltage signal VCM at the first amplitude. The method 600 includes multiple measurements at different applied common mode voltage signal amplitudes, and the controller 109 decides at 612 if the common mode rejection ratio testing is finished. If another measurement is needed (NO at 612), the controller adjusts the common mode voltage signal VCM to a different second amplitude at 614, and the adjusted common mode voltage signal VCM is applied at 608 to the non-inverting buffer inputs 131 and 141. The method 600 continues at 610 with measuring the DUT output voltage signal VS while applying the common mode voltage signal VCM at the second amplitude. Once a desired number of two or more measurements are obtained (YES at 612), the controller 109 computes the common mode rejection ratio CMRR of the DUT 160 at 616 based on the measured output voltage signals VS and two or more corresponding amplitudes of the applied common mode voltage signals VCM (e.g., as the difference in two voltage measurements divided by the difference in the first and second common mode voltage signal amplitudes). At 618, any desired further electrical testing of the engaged DUT 160 is performed. Once all tests are completed, the controller 109 uses the positioner apparatus 502 and the vacuum pump 504 to deposit the tested DUT 160 in a product carrier (not shown) at 620, and another DUT 160 is engaged at 622 for testing. The illustrated process 600 is then repeated for each successive DUT 160 to be tested.

Figure 7:
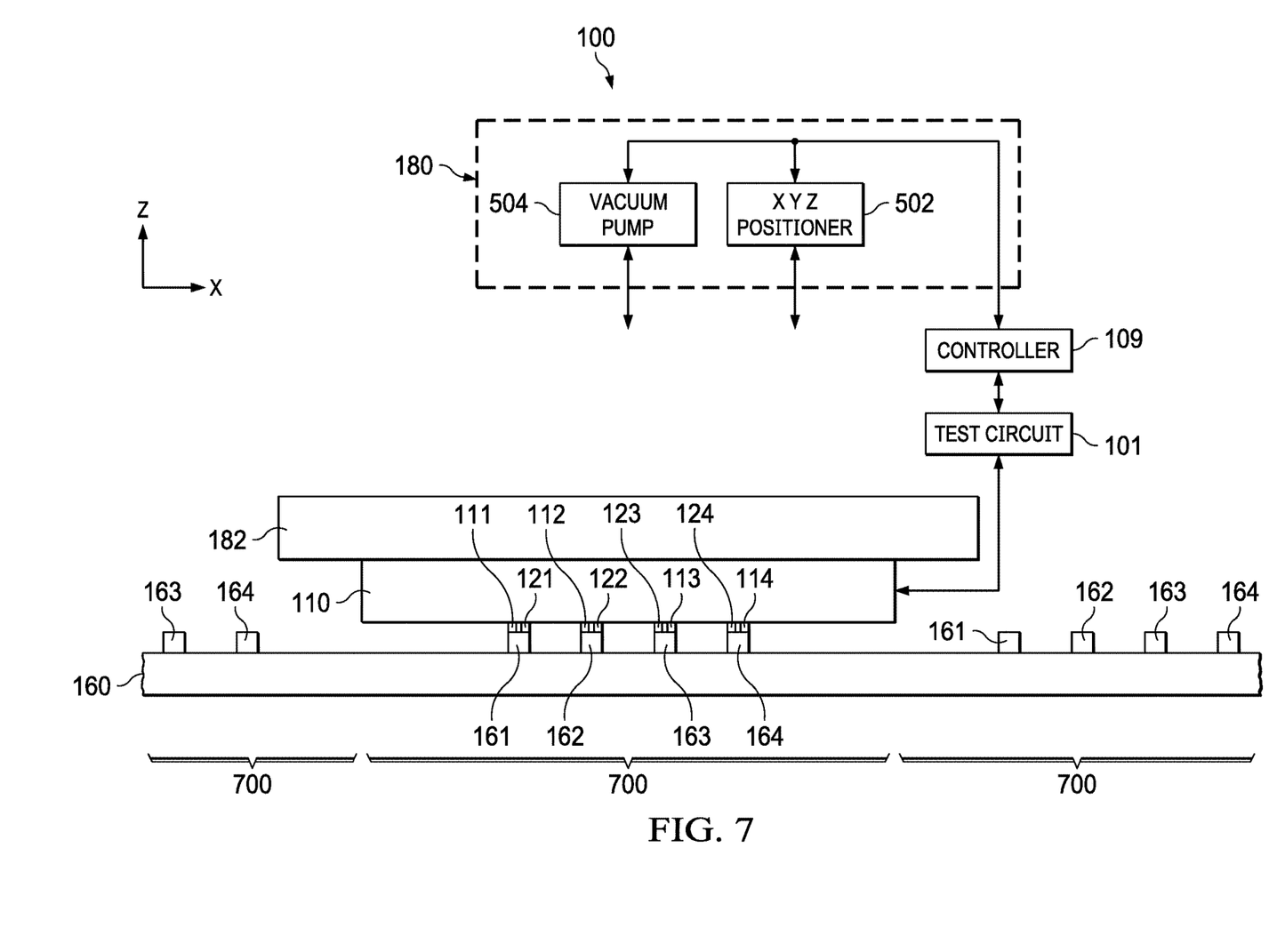
FIG. 7 is a system diagram of a wafer probe test system implementation for testing an electronic device of a processed semiconductor wafer.

FIG. 7 shows a wafer probe test system implementation of the system 100 of FIGS. 1-3 for testing an electronic device of a die region of a processed semiconductor wafer DUT 160. In one example, the wafer DUT 160 includes multiple device die regions prior to die separation or singulation, and each device die region has one or more electrical circuits to be tested in the system, such as an instrument amplifier circuit as shown in FIGS. 1-3 above. In this example, the conductive probes of the probe pairs (e.g., 111/121, 112/122, 113/123, 114/124, 115/125, 116/126, 117/127 and 118/128 in FIGS. 1-3) are wafer probe needles, which are configured to engage a respective bond pad conductive feature 161, 162, 163, 164, 165, 166, 167 and 168 of the semiconductor wafer DUT 160. The wafer DUT 160 in this example has multiple die regions 700, each including conductive features 161, 162, 163 and 164. The illustrated portion of the wafer DUT 160 shows portions of three of the die regions 700, with the contactor 110 positioned to engage a single one of the die regions 700 and the associated conductive features 161-164. In operation in one example, the controller 109 successively positions the support arm 182 to control the electrical interfacing of the contactor 110 at respective die locations of the semiconductor wafer DUT 160 to sequentially perform common mode rejection ratio tests (and possibly other electrical testing) of the circuits of the respective die locations according to the above described method 600.

The above examples are merely illustrative of several possible implementations of various aspects of the present disclosure, wherein equivalent alterations and/or modifications will occur to others skilled in the art upon reading and understanding this specification and the annexed drawings. Modifications are possible in the described examples, and other implementations are possible, within the scope of the claims.

What is claimed is:

1. A system, comprising:
   a contactor, including probe pairs individually including first and second conductive probes arranged to be coupled to a respective conductive feature of a device under test (DUT);
   a test circuit coupled to the contactor, the test circuit comprising:
   a voltage source, including a first output to provide a common mode voltage signal, and a second output coupled to a reference node;
   a first buffer, including: a first input coupled to the first output of the voltage source, an output coupled to a first conductive probe of a first probe pair arranged to be coupled to a conductive feature connected to a first input node of the DUT, and a second input coupled to a second conductive probe of the first probe pair; and
   a second buffer, including: a first input coupled to the first output of the voltage source, an output coupled to a first conductive probe of a second probe pair arranged to be coupled to a conductive feature connected to a second input node of the DUT, and a second input coupled to a second conductive probe of the second probe pair.

2. The system of claim 1, wherein the test circuit further comprises:
   a first switch coupled between the output of the first buffer and the first conductive probe of the first probe pair;
   a second switch coupled between the second input of the first buffer and the second conductive probe of the first probe pair;
   a third switch coupled between the output of the second buffer and the first conductive probe of the second probe pair; and
   a fourth switch coupled between the second input of the second buffer and the second conductive probe of the second probe pair.

3. The system of claim 1, wherein the test circuit further comprises:
   a switch coupled between the first buffer and the first probe pair; and
   another switch coupled between the second buffer and the second probe pair.

4. The system of claim 3, wherein the test circuit further comprises a buffer supply circuit referenced to the first output of the voltage source, the buffer supply circuit including: a first output coupled to first supply nodes of the first and second buffers, and a second output coupled to second supply nodes of the first and second buffers.

5. The system of claim 4, wherein the test circuit further comprises a second supply circuit referenced to the reference node, the second supply circuit including:
   a first output coupled to conductive probes of another probe pair arranged to be coupled to a conductive feature connected to a first supply node of the DUT; and
   a second output coupled to conductive probes of a further probe pair arranged to be coupled to a conductive feature connected to a second supply node of the DUT.

6. The system of claim 1, wherein the test circuit further comprises a buffer supply circuit referenced to the first output of the voltage source, the buffer supply circuit including: a first output coupled to first supply nodes of the first and second buffers, and a second output coupled to second supply nodes of the first and second buffers.

7. The system of claim 6, wherein the test circuit further comprises a second supply circuit referenced to the reference node, the second supply circuit including:
   a first output coupled to conductive probes of another probe pair arranged to be coupled to a conductive feature connected to a first supply node of the DUT; and
   a second output coupled to conductive probes of a further probe pair arranged to be coupled to a conductive feature connected to a second supply node of the DUT.

8. The system of claim 1, wherein the first and second conductive probes of the probe pairs are pins or contacts configured to engage a respective conductive pin or lead feature of a packaged electronic device DUT.

9. The system of claim 1, wherein the first and second conductive probes of the probe pairs are wafer probe needles configured to engage a respective bond pad of a wafer die region.

10. The system of claim 1, wherein the first and second buffers are operational amplifiers.

11. A test circuit, comprising:
    a voltage source, including a first output to provide a common mode voltage signal, and a second output coupled to a reference node;
    a first buffer, including: a first input coupled to the first output of the voltage source, an output arranged to be coupled to a first conductive probe of a contactor, and a second input arranged to be coupled to a second conductive probe of the contactor;
    a second buffer, including: a first input coupled to the first output of the voltage source, an output coupled to a third conductive probe of the contactor, and a second input coupled to a fourth conductive probe of the contactor; and a buffer supply circuit referenced to the first output of the voltage source, the buffer supply circuit including: a first output coupled to first supply nodes of the first and second buffers, and a second output coupled to second supply nodes of the first and second buffers.

12. The test circuit of claim 11, further comprising:
a first switch coupled between the output of the first buffer and the first conductive probe;
a second switch coupled between the second input of the first buffer and the second conductive probe;
a third switch coupled between the output of the second buffer and the third conductive probe; and
a fourth switch coupled between the second input of the second buffer and the fourth conductive probe.

13. The test circuit of claim 11, further comprising:
a switch coupled between the first buffer and one of the first and second conductive probes; and
another switch coupled between the second buffer and one of the third and fourth conductive probes.

14. The test circuit of claim 11, wherein the first and second buffers are operational amplifiers.

15. A method, comprising:
engaging probe pairs of a contactor to respective conductive features of a device under test (DUT);
coupling outputs of first and second buffers to respective first and second probe pairs of the contactor;
applying a common mode voltage signal at a first amplitude to non-inverting inputs of the first and second buffers;
measuring a first output voltage signal of the DUT at another probe pair of the contactor while applying the common mode voltage signal at the first amplitude;
adjusting the common mode voltage signal to a different second amplitude;
measuring the output voltage signal of the DUT while applying the common mode voltage signal at the second amplitude; and
computing a common mode rejection ratio of the DUT based on the measured output voltage signals and the first and second amplitudes of the common mode voltage signals.

16. The method of claim 15, wherein coupling the outputs of the first and second buffers to the respective first and second probe pairs includes:
closing a first switch between the output of the first buffer and a first conductive probe of the first probe pair;
closing a second switch between an inverting input of the first buffer and a second conductive probe of the first probe pair;
closing a third switch between the output of the second buffer and a first conductive probe of the second probe pair; and
closing a fourth switch between an inverting input of the second buffer and a second conductive probe of the second probe pair.

17. The method of claim 15, wherein coupling the outputs of the first and second buffers to the respective first and second probe pairs includes:
closing a switch between the first buffer and the first probe pair; and
closing another switch between the second buffer and the second probe pair.

18. The method of claim 15, further comprising:
powering the first and second buffers with supply voltages referenced to the common mode voltage signal.

19. The method of claim 15, wherein engaging the probe pairs of the contactor to respective conductive features of the DUT includes:
engaging pins or contacts of the contactor to respective conductive pin or lead feature of a packaged electronic device DUT.

20. The method of claim 15, wherein engaging the probe pairs of the contactor to respective conductive features of the DUT includes:
engaging wafer probe needles of the contactor to respective bond pads of a wafer die region.

* * * * *